United States Patent
Su et al.

(10) Patent No.: US 9,155,208 B2
(45) Date of Patent: Oct. 6, 2015

(54) CONDUCTIVE CONNECTION STRUCTURE FOR CONDUCTIVE WIRING LAYER OF FLEXIBLE CIRCUIT BOARD

(71) Applicant: ADVANCED FLEXIBLE CIRCUITS CO., LTD., Taoyuan County (TW)

(72) Inventors: Kuo-Fu Su, Taoyuan County (TW); Gwun-Jin Lin, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 32 days.

(21) Appl. No.: 14/138,383

(22) Filed: Dec. 23, 2013

(65) Prior Publication Data

US 2014/0374148 A1    Dec. 25, 2014

(30) Foreign Application Priority Data

Jun. 19, 2013   (TW) .............................. 102121671 A

(51) Int. Cl.
*H05K 1/11* (2006.01)
*H05K 1/02* (2006.01)
*H05K 3/40* (2006.01)

(52) U.S. Cl.
CPC ............ *H05K 3/4061* (2013.01); *H05K 1/0283* (2013.01); *H05K 1/115* (2013.01); *H05K 1/118* (2013.01); *H05K 2201/09845* (2013.01); *H05K 2201/09854* (2013.01); *H05K 2203/1572* (2013.01)

(58) Field of Classification Search
CPC . H05K 1/115; H05K 1/118; H05K 2201/096; H05K 1/11; H05K 1/09; H05K 1/092; H05K 1/03; H05K 1/0393; H05K 1/0224; H05K 2201/03; H05K 2201/032; H05K 3/12; H05K 3/1216; H05K 3/1241; H05K 3/125; H05K 3/1258
USPC .......... 174/117 F, 117 FF, 250–268; 361/748, 361/760, 792–795
See application file for complete search history.

(56) References Cited

U.S. PATENT DOCUMENTS

| | | | | |
|---|---|---|---|---|
| 5,200,579 A | * | 4/1993 | Takeuchi | 174/256 |
| 8,022,308 B2 | * | 9/2011 | Hu et al. | 174/254 |
| 2010/0326706 A1 | * | 12/2010 | Muro et al. | 174/254 |

* cited by examiner

*Primary Examiner* — Ishwarbhai B Patel
(74) *Attorney, Agent, or Firm* — Rosenberg, Klein & Lee

(57) ABSTRACT

A conductive connection structure for a conductive wiring layer of a flexible circuit board includes a first through hole and a second through hole formed in a lamination structure including a conductive wiring layer, a first covering layer, and a second covering layer. The first through hole extends through the first covering layer and the conductive wiring layer. The second through hole extends through the second covering layer. The second through hole is formed at a location corresponding to an exposed zone on a second surface of the conductive wiring layer and communicates with the first through hole. A first conductive paste layer is formed on a surface of the first covering layer and fills in the first through hole to form a pillar portion in the first through hole. The pillar portion has a bottom end forming a curved cap. The exposed zone of the second surface of the conductive wiring layer is at least partially covered by the curved cap.

10 Claims, 3 Drawing Sheets

CONDUCTIVE CONNECTION STRUCTURE FOR CONDUCTIVE WIRING LAYER OF FLEXIBLE CIRCUIT BOARD

BACKGROUND OF THE INVENTION

1. Field of the Invention

The present invention relates to a structure design of a circuit board, and in particular to a conductive connection structure for a conductive wiring layer of a flexible circuit board.

2. The Related Arts

Most of various kinds of electronic equipment uses circuit boards or flexible flat cables for positioning various types of necessary circuit components and connectors and for transmitting electronic signals. In the manufacturing art of circuit boards, wiring techniques are applied to form extended signal transmission lines on a surface of a substrate for transmission of electronic signals.

Being commonly adopted in structure designs of flexible circuit boards, a flexible circuit board generally comprises a lamination structure that is composed of a first conductive wiring layer, a first covering layer, and a second covering layer vertically stacked over each other. To enable a conductive wiring layer to be used as a signal transmission line, a grounding line, a power transmission line, a shielding layer, an impedance control layer, or to provide the function of signal wire jumper and conductive connection, it is a common practice to form a conductive through hole in the lamination structure of the flexible circuit board to realize electrical connection. For the known techniques, it is tedious and sophisticated to form the conductive through hole and it is generally impossible to effectively simplify the operation and reduce the cost.

SUMMARY OF THE INVENTION

Thus, an object of the present invention is to provide a conductive connection structure for a conductive wiring layer of a flexible circuit board, which enables formation of a conductive paste layer in a lamination structure of a flexible circuit and also formation of a conductive structure in a through hole through a simple manufacturing process.

To achieve the above object, in a lamination structure that comprises a conductive wiring layer, a first covering layer, a second covering layer, a first covering layer, and a second covering layer, a first through hole and a second through hole are formed, wherein the first through hole extends through the first covering layer and the conductive wiring layer and the second through hole extends through the second covering layer. The second through hole is formed at a location corresponding to an exposed zone on a second surface of the conductive wiring layer and communicates with the first through hole. A first conductive paste layer is formed on a surface of the first covering layer and fills in the first through hole to form a pillar portion in the first through hole. The pillar portion has a bottom end forming a curved cap. The exposed zone of the second surface of the conductive wiring layer is at least partially covered by the curved cap. The second covering layer has a surface on which a second conductive paste layer is formed. The second conductive paste layer fills in the second through hole and covers a surface of the curved cap.

In a preferred embodiment of the present invention, the first covering layer and the second covering layer are bonded by a bonding material layer to the conductive wiring layer, or are alternatively coupled to the surfaces of the conductive wiring layer by means of adhesive-free techniques.

As to the efficacy, the present invention provides a conductive connection structure for a conductive wiring layer of a flexible circuit board, which, at the same time when a conductive paste layer is being applied, enables the formation of a pillar portion and a curved cap in a through hole formed in a lamination structure of the flexible circuit board in such a way that the curved cap completely or at least partially covers an exposed zone on a surface of the conductive wiring layer. Thus, excellent conductive connection can be made with the conductive wiring layer in respect of conductivity and advantages such as easy manufacture, simplified process, and reduced cost can be achieved in a practical application.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
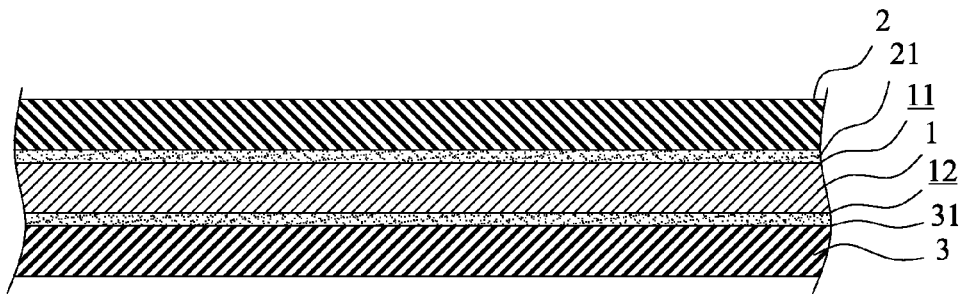
FIG. 1 is a schematic view showing a first embodiment of the present invention, in which a conductive wiring layer, a first covering layer, and a second covering layer are vertically stacked to form a lamination structure of the flexible circuit board.

With reference to the drawings and in particular to FIGS. 1-4, schematic views are given to show a conductive connection structure for a conductive wiring layer of a flexible circuit board constructed in accordance with a first embodiment of the present invention. According to the present invention, a lamination structure that comprises a conductive wiring layer 1, a first covering layer 2, and a second covering layer 3 vertically stacked over each other is provided for a the flexible circuit board (as shown in FIG. 1), wherein the first covering layer 2 is bonded by a bonding material layer 21 to a first surface 11 of the conductive wiring layer 1. The second covering layer 3 is bonded by a bonding material layer 31 to a second surface 12 of the conductive wiring layer 1.

A perforation zone A is defined in a selected site of the conductive wiring layer 1 and an exposed zone B is defined in the second surface 12 of the conductive wiring layer 1 at a location adjacent to the perforation zone A.

Figure 2:
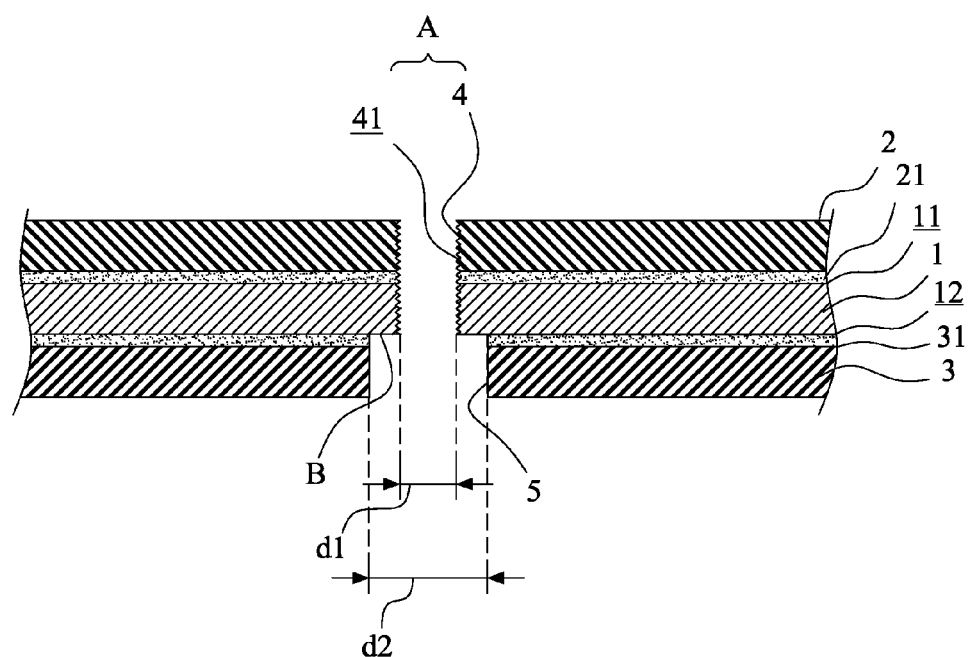
FIG. 2 is a schematic view showing formation of a first through hole and a second through hole in the lamination structure of FIG. 1.

In the lamination structure of the conductive wiring layer 1, the first covering layer 2, and the second covering layer 3 that is formed as discussed above, in the site where the perforation zone A is defined in the conductive wiring layer 1, at least one first through hole 4 and a second through hole 5 corresponding to the first through hole 4 are formed (as shown in FIG. 2).

The first through hole 4 extends through the first covering layer 2 and the conductive wiring layer 1 and the first through hole 4 is formed at a location exactly corresponding to the perforation zone A defined in the conductive wiring layer 1. The first through hole 4 has a wall surface, which is preferably formed with a roughened surface structure 41. The roughened surface structure 41 can be formed by applying a drilling tool to form a roughened surface on the wall surface of the first through hole 4 during a drilling operation. Alternatively, the roughened surface structure 41 can be formed by applying laser energy drilling to form a roughed surface on the wall surface of the first through hole 4 in a drilling operation, or simply by applying a chemical agent to form the roughened surface.

The second through hole 5 extends through the second covering layer 3. The second through hole 5 is formed at a location corresponding to the exposed zone B of the second surface 12 of the conductive wiring layer 1 and corresponds to and communicates with the first through hole 4. The second through hole 5 has a bore diameter d2 that is greater than a bore diameter d1 of the first through hole 4, so that the exposed zone B of the second surface 12 of the conductive wiring layer 1 is not completely covered by the second covering layer 3.

In a preferred embodiment of the present invention, the bore diameter d1 of the first through hole 4 is between 0.1-1.0 mm, preferably between 0.15-0.3 mm.

Figure 3:
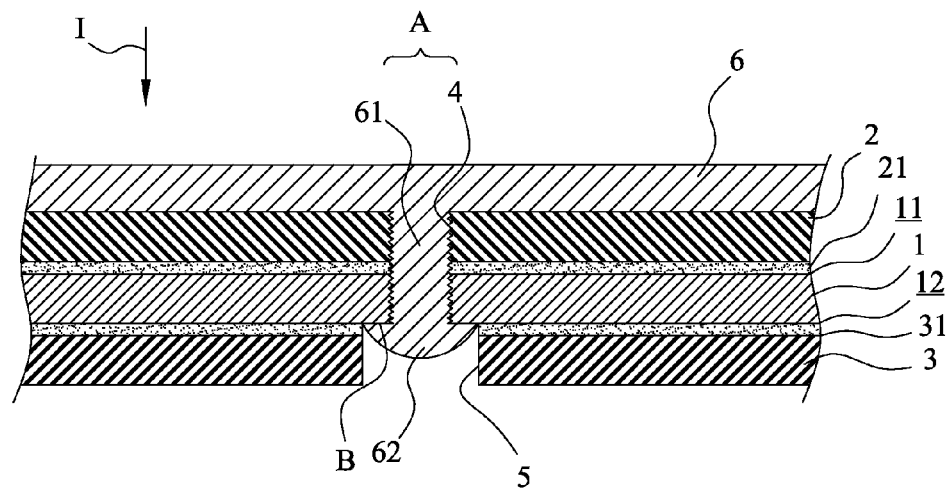
FIG. 3 is a schematic view showing application of a first conductive paste layer on a surface of the first covering layer.

After the formation of the first through hole 4 and the second through hole 5, a first conductive paste layer 6, which is temporarily in a paste form, is applied in a paste coating direction I, in a top-to-down manner, to a surface of the first covering layer 2 (as shown in FIG. 3). Under this condition, the first conductive paste layer 6 is driven by the gravity of the paste to automatically fill up the first through hole 4 to form a pillar portion 61 in the first through hole 4 and meanwhile, a curved or rounded cap 62 is formed at a bottom end of the pillar portion 61 in such a way that the curved cap 62 at least partially, or completely, cover the exposed zone B of the second surface 12 of the conductive wiring layer 1.

Figure 4:
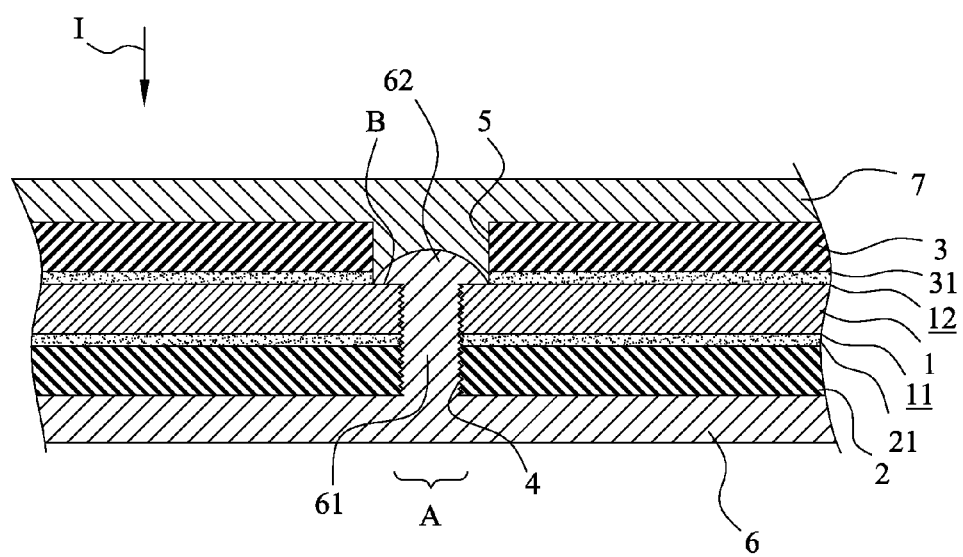
FIG. 4 is a schematic view showing application of a second conductive paste layer on a surface of the second covering layer.

After the formation of the first conductive paste layer 6, the pillar portion 61, and the curved cap 62, the lamination structure of the flexible circuit board is reversed up-side down and a second conductive paste layer 7 is coated and thus formed on a surface of the second covering layer 3 in such a way that the second conductive paste layer 7 fills up the second through hole 5 (as shown in FIG. 4). As such, a conductive connection structure for a conductive wiring layer of a flexible circuit board according to the present invention is completed (as shown in FIG. 5).

The first conductive paste layer 6 and the second conductive paste layer 7 can be one of silver, aluminum, copper, conductive carbon, conductive particle-included resin layer.

Figure 5:
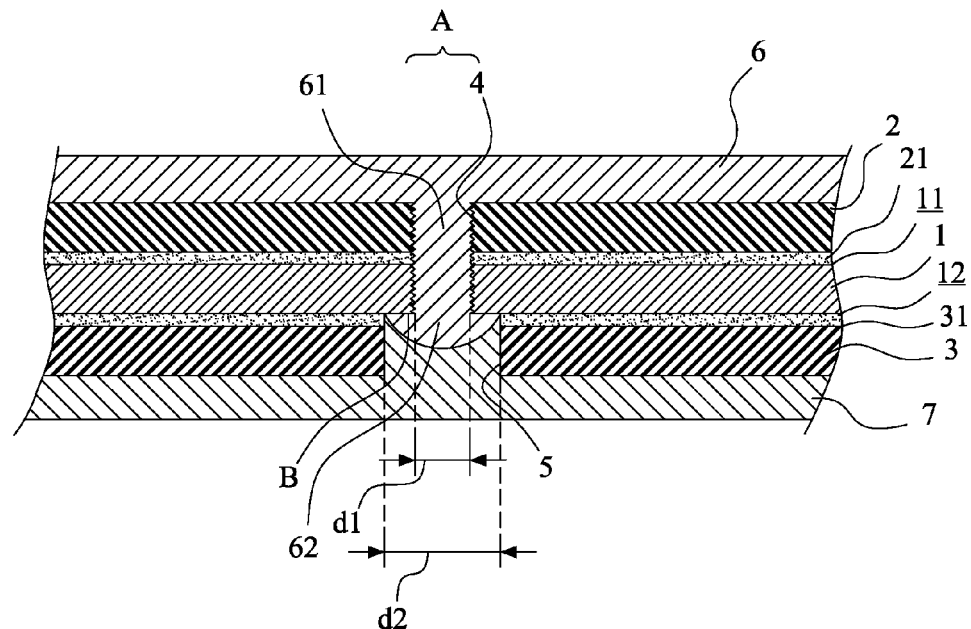
FIG. 5 is a schematic view showing a conductive connection structure for a conductive wiring layer of a flexible circuit board according to the present invention.

As shown in FIG. 5, the conductive connection structure for a conductive wiring layer of a flexible circuit board according to the present invention comprises:

a conductive wiring layer 1, which has a first surface 11 and a second surface 12, the conductive wiring layer 1 comprising a perforation zone 4 formed at a predetermined location, the second surface 12 of the conductive wiring layer 1 comprising an exposed zone B defined thereon at a location adjacent to the perforation zone 4;

a first covering layer 2, which is formed on the first surface 11 of the conductive wiring layer 1;

a second covering layer 3, which is formed on the second surface 12 of the conductive wiring layer 1;

a first through hole 4, which extends through the first covering layer 2 and the conductive wiring layer 1, the first through hole 4 being formed at a location corresponding to the perforation zone A of the conductive wiring layer 1;

a second through hole 5, which extends through the second covering layer 3, the second through hole 5 being formed at a location corresponding to the exposed zone B of the second surface 12 of the conductive wiring layer 1 and intercommunicating with the first through hole 4, the second through hole 5 having a bore diameter d2 that is greater than a bore diameter d1 of the first through hole 4, so that the exposed zone B of the second surface 12 of the conductive wiring layer 1 is not covered by the second covering layer 3;

a first conductive paste layer 6, which is formed on a surface of the first covering layer 2 and filled in the first through hole 4 to form a pillar portion 61 in the first through hole 4; and the pillar portion 61 having a bottom end forming a curved cap 62, which at least partially covers the exposed zone B of the second surface 12 of the conductive wiring layer 1.

With the above described arrangement, in a practical application of the present invention, the first conductive paste layer and the second conductive paste layer can both serve as one of a signal transmission line, a grounding line, a power transmission line, a shielding layer, and an impedance control layer.

Figure 6:
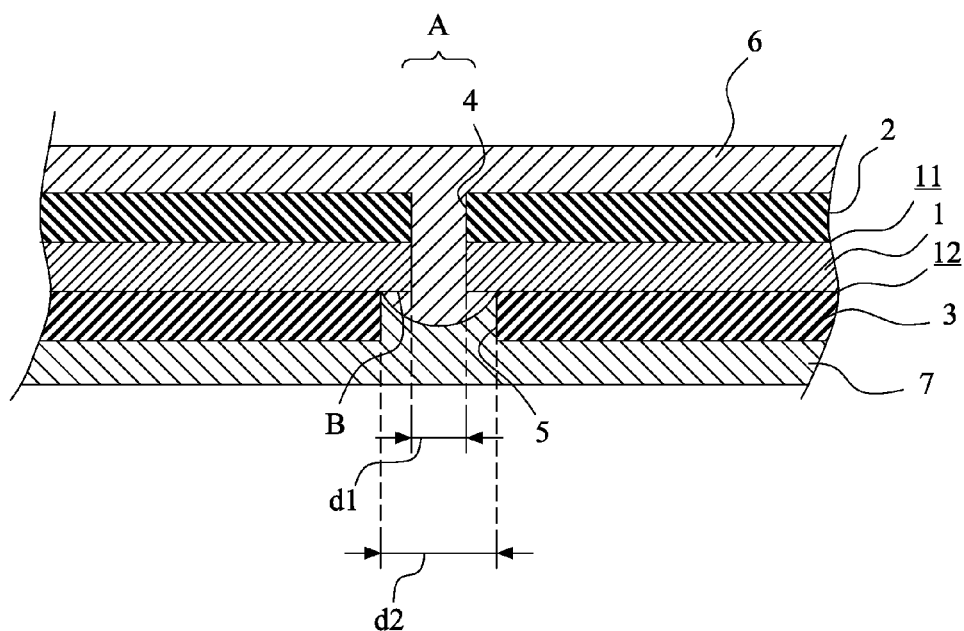
FIG. 6 is a schematic view showing a conductive connection structure for a conductive wiring layer of a flexible circuit board according to a second embodiment of the present invention.

Referring to FIG. 6, a schematic view showing a conductive connection structure for a conductive wiring layer of a flexible circuit board according to a second embodiment of the present invention is given. The instant embodiment is substantially identical to the embodiment illustrated in FIG. 5 and a difference resides in that the first covering layer 2 is not limited to being bonded by a bonding material layer to the first surface 11 of the conductive wiring layer 1, and instead, the first covering layer 2 is coupled to the conductive wiring layer 1 by means of adhesive-free techniques. For example, the first covering layer can be formed by coating on a surface of the conductive wiring layer, or the conductive wiring layer can be formed through sputtering on a surface of the first covering layer. Similarly, the second covering layer 3 can be coupled to the second surface 12 of the conductive wiring layer through adhesive-free techniques.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A conductive connection structure for a conductive wiring layer of a flexible circuit board, wherein the flexible circuit board comprises:

a conductive wiring layer, which has a first surface and a second surface, the conductive wiring layer comprising a perforation zone formed at a predetermined location, the second surface of the conductive wiring layer comprising an exposed zone defined thereon at a location adjacent to the perforation zone;

a first covering layer, which is formed on the first surface of the conductive wiring layer; and a second covering layer, which is formed on the second surface of the conductive wiring layer;

a first through hole, which extends through the first covering layer and the conductive wiring layer, the first through hole being formed at a location corresponding to the perforation zone of the conductive wiring layer;

a second through hole, which extends through the second covering layer, the second through hole being formed at a location corresponding to the exposed zone of the second surface of the conductive wiring layer and intercommunicating with the first through hole, the second through hole having a bore diameter that is greater than a bore diameter of the first through hole, so that the exposed zone of the second surface of the conductive wiring layer is not covered by the second covering layer; and a first conductive paste layer, which is formed on a surface of the first covering layer and filled in the first through hole to form a pillar portion in the first through hole;

wherein the pillar portion has a bottom end forming a curved cap, and the exposed zone of the second surface of the conductive wiring layer is at least partially covered by the curved cap.

2. The conductive connection structure as claimed in claim 1, wherein the second covering layer has a surface that receives a second conductive paste layer formed thereon, the second conductive paste layer being filled in the second through hole and covering a surface of the curved cap.

3. The conductive connection structure as claimed in claim 1, wherein the first conductive paste layer is selected from a group consisting of silver, aluminum, copper, conductive carbon, conductive particle-included resin layer.

4. The conductive connection structure as claimed in claim 1, wherein the second conductive paste layer is selected from a group consisting of silver, aluminum, copper, conductive carbon, conductive particle-included resin layer.

5. The conductive connection structure as claimed in claim 1, wherein the first conductive paste layer serves as one of a signal transmission line, a grounding line, a power transmission line, a shielding layer, and an impedance control layer.

6. The conductive connection structure as claimed in claim 1, wherein the second conductive paste layer serves as a signal transmission line, a grounding line, a power transmission line, a shielding layer, and an impedance control layer.

7. The conductive connection structure as claimed in claim 1, wherein the first covering layer is bonded by a bonding material layer to the first surface of the conductive wiring layer.

8. The conductive connection structure as claimed in claim 1, wherein the second covering layer is bonded by a bonding material layer to the second surface of the conductive wiring layer.

9. The conductive connection structure as claimed in claim 1, wherein the bore diameter of the first through hole is between 0.1-1.0 mm.

10. The conductive connection structure as claimed in claim 9, wherein the bore diameter of the first through hole is between 0.15-0.3 mm.

* * * * *